United States Patent
Abbott et al.

(10) Patent No.: US 7,268,415 B2
(45) Date of Patent: Sep. 11, 2007

(54) SEMICONDUCTOR DEVICE HAVING POST-MOLD NICKEL/PALLADIUM/GOLD PLATED LEADS

(75) Inventors: Donald C. Abbott, Norton, MA (US); Edgar R. Zuniga-Ortiz, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 296 days.

(21) Appl. No.: 10/985,758

(22) Filed: Nov. 9, 2004

(65) Prior Publication Data

US 2006/0097363 A1    May 11, 2006

(51) Int. Cl.
*H01L 23/495* (2006.01)

(52) U.S. Cl. .............................. 257/666; 257/E23.054; 438/123

(58) Field of Classification Search ................. 257/666; 438/123
See application file for complete search history.

(56) References Cited

U.S. PATENT DOCUMENTS

| | | | | |
|---|---|---|---|---|
| 5,521,432 A * | 5/1996 | Tsuji et al. | ................. | 257/677 |
| 5,635,755 A * | 6/1997 | Kinghorn | ..................... | 257/666 |
| 5,889,317 A * | 3/1999 | Huang et al. | ............... | 257/666 |
| 6,194,777 B1 * | 2/2001 | Abbott et al. | ............... | 257/666 |
| 6,245,448 B1 * | 6/2001 | Abbott | ........................ | 428/670 |
| 6,287,896 B1 * | 9/2001 | Yeh et al. | .................... | 438/123 |
| 6,376,901 B1 * | 4/2002 | Abbott | ........................ | 257/666 |
| 6,392,293 B2 * | 5/2002 | Sugihara et al. | ............ | 257/690 |
| 6,452,258 B1 * | 9/2002 | Abys et al. | .................. | 257/677 |
| 6,518,508 B2 * | 2/2003 | Park et al. | ................... | 174/255 |
| 6,545,344 B2 * | 4/2003 | Abbott | ........................ | 257/666 |
| 6,583,500 B1 * | 6/2003 | Abbott et al. | ............... | 257/666 |
| 6,593,643 B1 * | 7/2003 | Seki et al. | ................... | 257/677 |
| 6,646,330 B2 * | 11/2003 | Kubara et al. | .............. | 257/677 |
| 6,664,136 B2 * | 12/2003 | Motonami et al. | .......... | 438/123 |
| 6,713,852 B2 * | 3/2004 | Abbott et al. | ............... | 257/677 |
| 6,828,660 B2 * | 12/2004 | Abbott | ........................ | 257/666 |
| 6,838,757 B2 * | 1/2005 | Abbott et al. | ............... | 257/677 |
| 6,891,253 B2 * | 5/2005 | Miyaki et al. | ............... | 257/666 |
| 6,953,986 B2 * | 10/2005 | Abbott et al. | ............... | 257/666 |
| 6,960,823 B2 * | 11/2005 | Miyaki et al. | ............... | 257/676 |
| 7,038,306 B2 * | 5/2006 | Miyaki et al. | ............... | 257/677 |

\* cited by examiner

*Primary Examiner*—David A. Zarneke
(74) *Attorney, Agent, or Firm*—Tum Thach; Wade James Brady, III; Frederick J. Telecky, Jr.

(57) ABSTRACT

A semiconductor device having a leadframe comprised of a base metal (110, e.g., copper), a chip mount pad (103) and a plurality of lead segments (104). Each of the segments has a first end (104*a*) near the mount pad and a second end (104*b*) remote from the mount pad. The device further has a semiconductor chip (103) attached to the mount pad and electrical interconnections (107) between the chip and the first segment ends. Encapsulation material (120) covers the chip, the bonding wires and the first segment ends, yet leaves the second segment ends exposed. At least portions of the second segment ends have the base metal covered by a layer of solderable metal (130, e.g., nickel) and by an outermost layer of noble metal (140, e.g., stack of palladium and gold).

13 Claims, 1 Drawing Sheet

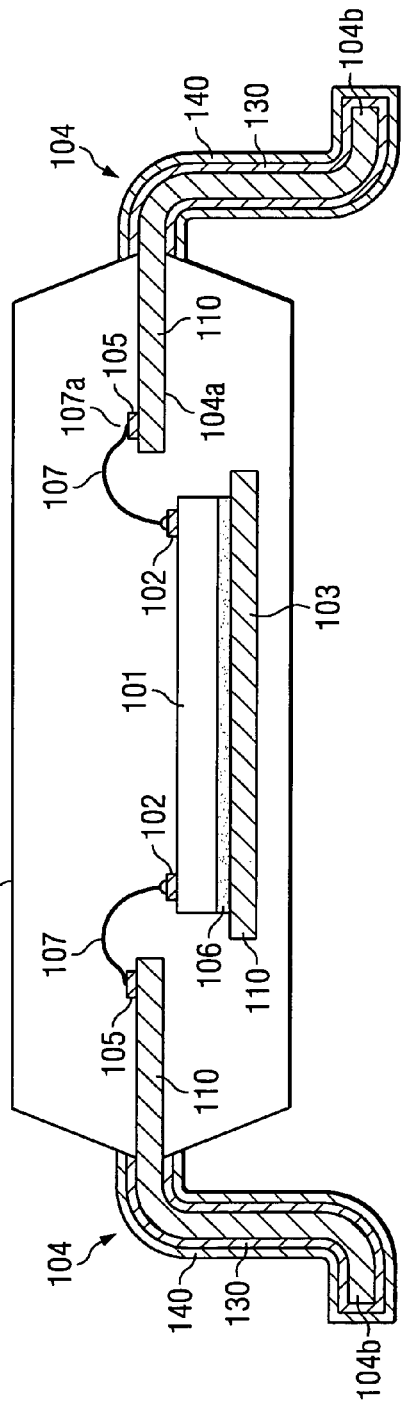
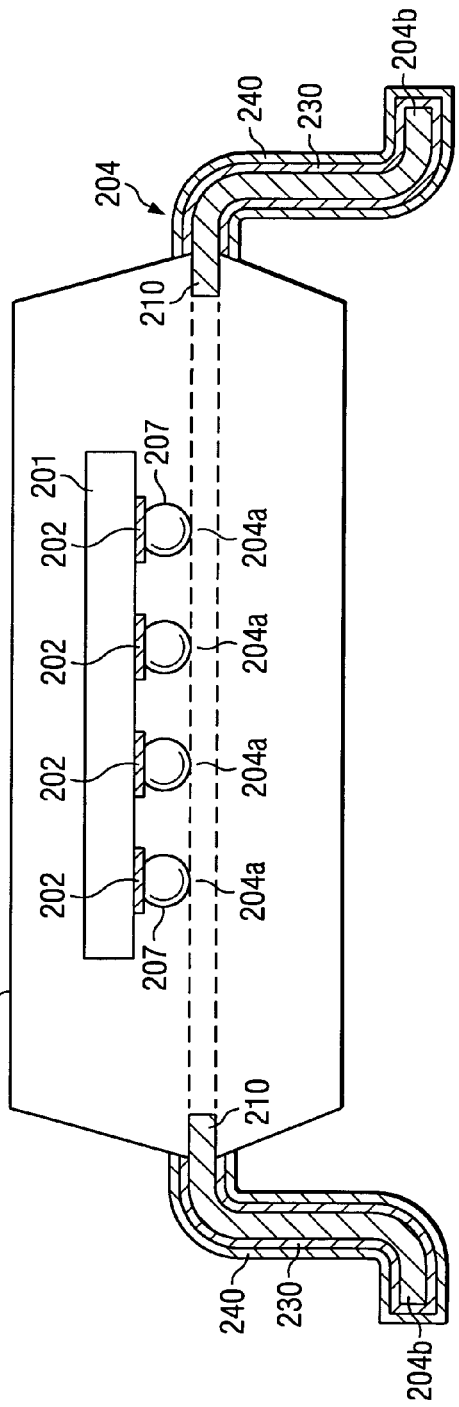

SEMICONDUCTOR DEVICE HAVING POST-MOLD NICKEL/PALLADIUM/GOLD PLATED LEADS

FIELD OF THE INVENTION

The present invention is related in general to the field of semiconductor devices and processes, and more specifically to the materials and fabrication of leadframes for integrated circuit devices and semiconductor components.

DESCRIPTION OF THE RELATED ART

Leadframes for semiconductor devices provide a stable support pad for firmly positioning the semiconductor chip, usually an integrated circuit (IC) chip within a package. Since the leadframe, including the pad, is made of electrically conductive material, the pad may be biased, when needed, to any electrical potential required by the network involving the semiconductor device, especially the ground potential.

In addition, the leadframe offers a plurality of conductive segments to bring various electrical conductors into close proximity of the chip. The remaining gap between the inner tip of the segments and the contact pads on the IC surface are bridged connectors, typically thin metallic wires individually bonded to the IC contact pads and the leadframe segments. Consequently, the lead material has to be suitable for stitch-attaching the connectors.

Also, the ends of the lead segment remote from the IC chip ("outer" tips) need to be electrically and mechanically connected to external circuitry, for instance to assembly printed circuit boards. In the overwhelming majority of electronic applications, this attachment is performed by soldering, conventionally with lead-tin (Pb/Sn) eutectic solder at a reflow temperature in the 210 to 220° C. range.

Finally, the leadframe provides the framework for encapsulating the sensitive chip and fragile connecting wires. Encapsulation using plastic materials, rather than metal cans or ceramic, has been the preferred method because of low cost. The transfer molding process for epoxy-based thermoset compounds at 175° C. has been practiced for many years. The temperature of 175° C. for molding and mold curing (polymerization) is compatible with the temperature of 210 to 220° C. for eutectic solder reflow.

Reliability tests in moist environments require that the molding compound have good adhesion to the leadframe and the device parts it encapsulates. Two major contributors to good adhesion are the chemical affinity of the molding compound to the metal of the leadframe and the surface roughness of the leadframe.

The recent general trend to avoid Pb in the electronics industry and use Pb-free solders, pushes the reflow temperature range into the neighborhood of about 260° C. This higher reflow temperature range makes it more difficult to maintain the mold compound adhesion to the leadframes required to avoid device delamination during reliability testing at moisture levels. For this temperature range, known leadframes do not offer metallization for good adhesion combined with low cost, easy manufacturability, and avoidance of whiskers.

It has been common practice to manufacture single piece leadframes from thin (about 120 to 250 µm) sheets of metal. For reasons of easy manufacturing, the commonly selected starting metals are copper, copper alloys, and iron-nickel alloys (for instance the so-called "Alloy 42"). The desired shape of the leadframe is etched or stamped from the original sheet. In this manner, an individual segment of the leadframe takes the form of a thin metallic strip with its particular geometric shape determined by the design. For most purposes, the length of a typical segment is considerably longer than its width.

Nickel plating of the leadframe starting metal has been shown to be desirable because nickel reduces the propensity for tin dendrite/whisker growth in devices with tin-plated leads, a generally feared failure phenomenon. Nickel, however, has poor adhesion to most molding compounds. Therefore, it is typically coated with a thin layer of palladium or gold. The pressure of cost reduction, though, in semiconductor manufacturing requires that noble metals be used cautiously.

SUMMARY OF THE INVENTION

A need has therefore arisen for a low cost, reliable leadframe combining adhesion to molding compounds, bondability for connecting wires, and avoiding the risk of tin dendrite growth. There are technical advantages, when the leadframe and its method of fabrication is low cost and flexible enough to be applied for different semiconductor product families and a wide spectrum of design and assembly variations, and achieves improvements toward the goals of improved process yields and device reliability. There are further technical advantages, when these innovations are accomplished using the installed equipment base so that no investment in new manufacturing machines is needed.

One embodiment of the present invention is a semiconductor device, which has a leadframe comprised of a base metal, a chip mount pad and a plurality of lead segments. Each of the segments has a first end near the mount pad and a second end remote from the mount pad. The device further has a semiconductor chip attached to the mount pad and electrical interconnections between the chip and the first segment ends. Encapsulation material covers the chip, the bonding wires and the first segment ends, yet leaves the second segment ends exposed. At least portions of the second segment ends have the base metal covered by a layer of solderable metal and by an outermost layer of sacrificial noble metal.

Preferred leadframe base metals are copper or an iron-nickel alloy, the preferred solderable metal is nickel, and a preferred noble metal is a stack of a palladium layer and a gold layer.

Another embodiment of the invention is a method for fabricating a semiconductor device, which starts by providing a leadframe comprising a base metal, a mount pad and a plurality of lead segments; each of the segments have a first end near the mount pad and a second end remote from the mount pad. Next, a semiconductor chip is provided and attached to the mount pad; the chip is then electrically connected with the first segment ends by bonding wires or reflow elements, respectively. Next, the chip, the bonding wires and the first segment ends are encapsulated, however the yet second segment ends remain exposed.

In the preferred method, the base metal of the second segment ends is then electrolytically plated with a layer of solderable metal, and thereafter with a layer of noble metal; and finally the second segment ends are trimmed and formed. Alternatively, the second segment ends are trimmed and formed right after the encapsulation step, and finally the base metal of the formed second segment ends is electroless plated with a layer of solderable metal and thereafter with a layer of noble metal.

It is a technical advantage that according to the invention, there is no tin involved in the plating of the outer segment ends; consequently, there is no risk of whisker formation.

It is another technical advantage that the encapsulation compound is in direct contact with the bare leadframe base metal (preferably copper or an iron-nickel alloy) inside the encapsulated device. This fact represents the most favorable condition for good adhesion between the device parts.

The technical advances represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIG. 1 illustrates a schematic cross section of an embodiment of the invention, showing a molded semiconductor device with exposed leads, which are plated according to the invention.

FIG. 2 illustrates a schematic cross section of another embodiment of the invention, showing another molded semiconductor device with exposed leads, which are plated according to the invention.

DETAILED DESCRIPTION OF THE PREFERRED EMBODIMENTS

FIGS. 1 and 2 illustrate examples of semiconductor device applications of leadframes incorporating an embodiment of the invention. Both examples are molded surface mount devices, FIG. 1 is a small-outline package with gull-wing shaped outer lead segments, having a wire-bonded chip inside, and FIG. 2 a small-outline package with gull-wing shaped outer lead segments, having a flip-chip assembled component inside.

In the schematic cross section of FIG. 1, the device, generally designated 100, has a semiconductor chip 101 and a plurality of bond pads 102 suitable for wire bonding. In the schematic cross section of FIG. 2, the device, generally designated 200, has a semiconductor chip 201 and a plurality of bond pads 202 suitable for reflow metal (for example, solder) attachment. In both FIGS., the chip is assembled on a leadframe.

As defined herein, the starting material of the leadframe is called the "base metal", indicating the type of metal. Consequently, the term "base metal" is not to be construed in an electrochemical sense (as in opposition to "noble metal") or in a structural sense.

In FIG. 1, the leadframe consists of a base metal 110 and has the structural elements of the chip mount pad 103 and a plurality of lead segments 104. Each segment 104 has a first end 104a near the chip mount pad 103 and a second end 104b remote from the chip mount pad 103. First segment ends 104a may have, on one surface, a metal layer spot 105 to facilitate the bondability of the base metal for wire interconnections; a preferred metal choice for spot 105 is thin-plated silver (2 to 4 µm).

In FIG. 2, the leadframe consists of a base metal 210 and has only the structural elements of the plurality of lead segments 204, but no chip mount pad. Each segment 204 has a first end 204a near chip 201, whereby each first end 204a is dedicated to a specific chip bond pad 202. FIG. 2 does not display each first end 204a and its specific assignment to a chip bond pad 202, but rather summarizes all first ends 204a in a schematic dashed outline. Each lead segment 204 in FIG. 2 further has a second end 204b remote from chip 201.

The preferred base metals for the leadframes in FIGS. 1 and 2 are copper or copper alloys. Other alternatives include brass, aluminum, iron-nickel alloys (an example is the so-called Alloy 42), and covar.

Typically, base metals 110 and 210 originate with a metal sheet in the preferred thickness range from 100 to 300 µm; thinner sheets are possible. The ductility in this thickness range provides the 5 to 15% elongation that facilitates the segment bending and forming operation. The leadframe is stamped or etched from the starting metal sheet.

In FIG. 1, the semiconductor chip 101 is attached to chip pad 103 using adhesive material 106 (typically an epoxy or polyimide which has to undergo polymerization). Electrical interconnections 107 span the gap between chip bond pads 102 and first segment ends 104a, specifically leadframe spots 105. The preferred bonding technique wire ball bonding; alternatives include ribbon and wedge bonding. The contact to spot 105 is provided by stitch bonds 107a. The bonding wires may be chosen, for example, from gold, copper, aluminum, and alloys thereof, or other suitable electrically conductive interconnections. Any of these metals provide reliable welds to the leadframe segments of the invention.

In FIG. 2, electrical interconnections between chip pads 202 and the segment first ends 204a are provided by reflow metal elements 207, for instance solder balls. To facilitate the reflow process and provide reliable solder joints, first ends 204a may have thin-layer metal spots, which enhance solderability, for example of palladium or gold (not shown in FIG. 2). Preferred reflow metals include tin and tin alloys such as tin/copper, tin/indium, tin/silver, tin/bismuth, and tin/lead. Another alternatives are indium and tin/silver/copper.

In FIGS. 1 and 2, encapsulation material 120 and 220, respectively, covers the chip (101 and 201), the interconnections (107 and 207), and the first segment ends (104a and 204a), but leaves the second segment ends (104b and 204b) exposed. Typically, the encapsulation material 120 and 220 is an epoxy-based molding compound, filled with inorganic fillers such as alumina, suitable for adhesion to silicon and the leadframe surfaces. The molding compound requires an extended polymerization period ("curing"; commonly at 175° C. for 5 to 6 hr).

As FIGS. 1 and 2 schematically illustrate, at least portions of the second segment ends 104b and 204b have the base metal 110 and 210, respectively, covered by a stack of a solderable metal layer and an outermost noble metal layer. In FIG. 1, the solderable metal layer is designated 130, and in FIG. 2, the solderable metal layer is designated 230. The outermost noble metal layer is designated 140 and 240, respectively.

The preferred solderable metal is nickel or a nickel alloy; the thickness range is preferably 0.5 to 2.0 µm. The preferred outermost metal is palladium or gold; alternatively, there may be two consecutive layers, the palladium layer in contact with the nickel layer, followed by the outermost gold layer on top of the palladium layer. The preferred thickness range for the palladium layer is 0.01 to 0.10 µm; the preferred thickness range for the gold layer is 0.003 to 0.015 µm. In the solder reflow process for the attachment of the device, the palladium and/or the gold layers are sacrificial and are dissolved into the liquid solder. Alternatives for the outermost layer include a layer of silver or of gold/silver alloy. These alternatives would obviously be less expensive than gold.

Another embodiment of the invention is a method for fabricating a semiconductor device with post-mold nickel/palladium/gold plated leads. The method starts with providing a semiconductor chip having a plurality of bond pads.

Next, a leadframe is provided, which consists of a base metal and has a plurality of lead segments, wherein each of these segments has a first end near the chip and a second end remote from the chip. Preferred base metal is copper. Preferably, the leadframe is provided in strip form of a plurality of individual leadframes connected by rails in strip form.

The next process step connects electrically the chip bond pads with the first segment ends, respectively. In some devices, this connection is provided by wire bonds, in other devices by reflow elements (e.g., solder balls).

In the next process step, the chip, the interconnections, and the first segment ends are encapsulated, for instance in a molding compound by the transfer molding technique. The encapsulation material, however, leaves the second segment ends exposed. The devices are still in the strip form of the leadframes. Thereafter, the exposed segment ends are deflashed and cleaned, and then activated by reducing the oxides on the surface of the exposed lead metals.

The next process step employs electrolytic plating to deposit, on the base metal of the second segment ends, a layer of solderable metal, followed by a layer of sacrificial noble metal. The preferred solderable metal is nickel, and the preferred sacrificial metals comprise the noble metals palladium and gold. For the plating process, a plurality of leadframe strips are hung on a line to be exposed to the plating solutions in the plating baths, with electrical bias applied. All of the exposed metal on the leadframe strip is electrically connected and thus allows electrolytic plating. The leadframe strips are than rinsed and dried.

The final step in the process flow comprises the operations of trimming and forming the second segment ends (of course, all scrap from these operations is saved for precious metal recovery). The trimming step removes the connecting leadframe rails and singulates the devices, and the forming step results, for example, in the gull wing shapes of the segments illustrated in FIGS. 1 and 2.

The above process flow is the preferred process flow; it performs the plating step after the molding step. An alternative process flow performs the plating step after the trim/form step. This flow proceeds as follows:

The method starts with providing a semiconductor chip having a plurality of bond pads. Next, a leadframe is provided, which consists of a base metal and has a plurality of lead segments, wherein each of these segments has a first end near the chip and a second end remote from the chip. Preferred base metal is copper. Preferably, the leadframe is provided in strip form of a plurality of individual leadframes connected by rails in strip form.

The next process step connects electrically the chip bond pads with the first segment ends, respectively. In some devices, this connection is provided by wire bonds, in other devices by reflow elements (e.g., solder balls).

In the next process step, the chip, the interconnections, and the first segment ends are encapsulated, for instance in a molding compound by the transfer molding technique. The encapsulation material, however, leaves the second segment ends exposed. The devices are still in the strip form of the leadframes.

The next process step comprises trimming and forming the second segment ends. The trimming step removes the connecting leadframe rails and singulates the devices, and the forming step results, for example, in the gull wing shapes of the segments illustrated in FIGS. 1 and 2.

Thereafter, the exposed segment ends are deflashed and cleaned, and then activated by reducing the oxides on the surface of the exposed lead metals.

The next process step employs electroless plating in order to deposit, on the base metal of the second segment ends, a layer of solderable metal, followed by a layer of sacrificial noble metal. (Electroless or immersion plating of solderable as well as noble metals is required because after the trim/form step, the outer segment ends are electrically isolated.) The preferred solderable metal is nickel, and the preferred sacrificial metals comprise the noble metals palladium and gold. The plating process is performed in a strip to strip plating line; the material handling is the same as in commercially available strip to strip lines, but with no requirement for rectifiers.

The final process step involves rinsing and drying of the leadframe strips.

The latter process flow has the advantage of resulting in absolutely no exposed base metal (e.g., copper) in the finished device. In the earlier process flow, there are by design regions of exposed base metal (e.g., copper) at the cut of the connecting rails (dam bars); in addition, there is frequently some exposed base metal, where the outer segment ends are bent by the forming process, because this process has a tendency to cause microcracks in the plated solderable metal.

The cost of the latter process flow is marginally higher than the cost of the former flow, because electroless plating is inherently more expensive than electrolytic plating.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor or compound material used in IC manufacturing.

As another example, the second (outer) segment ends may have a form other than gull wings. For instance, they may be shaped as pins, or as pieces of straight metal as required for so-called leadless devices.

It is therefore intended that the appended claims encompass any such modifications or embodiments.

We claim:

1. A semiconductor device, comprising:
    a semiconductor chip having a plurality of bond pads;
    a leadframe comprising a base metal and having a plurality of lead segments, each of said segments having a first end near said chip and a second end remote from said chip;
    electrical interconnections between said chip bond pads and said first segment ends, respectively;
    encapsulation material covering said chip, interconnections and first segment ends, yet leaving said second segment ends exposed; and
    at least portions of said second segment ends having said base metal covered by a stack of a solderable metal layer and an outermost noble metal layer.

2. The device according to claim 1 wherein said base metal is selected from a group consisting of copper, copper alloy, aluminum, iron-nickel alloy, and covar.

3. The device according to claim 1 wherein said encapsulation material is a molding compound.

4. The device according to claim 1 wherein said solderable metal comprises nickel or a nickel alloy.

5. The device according to claim 1 wherein said outermost layer comprises palladium.

6. The device according to claim 1 wherein said outermost layer comprises gold.

7. The device according to claim 1 wherein said outermost layer is a stack of a palladium layer, in contact with said solderable metal, and a gold layer, in contact with said palladium layer.

8. The device according to claim 1 further comprising a layer of a bondable metal on each of said first segment ends.

9. The device according to claim 8 wherein said bondable metal is silver.

10. The device according to claim 1 wherein said electrical interconnections between said chip bond pads and said first segment ends are bonding wires.

11. The device according to claim 1 wherein said electrical interconnections between said chip bond pads and said first segment ends are reflow metal elements.

12. A method for fabricating a semiconductor device, comprising the steps of:

providing a semiconductor chip having a plurality of bond pads;

providing a leadframe comprising a base metal and having a plurality of lead segments, each of said segments having a first end near said chip and a second end remote from said chip;

electrically connecting said chip bond pads with said first segment ends, respectively;

encapsulating said chip, interconnections, and first segment ends, yet leaving said second segment ends exposed;

electrolytically plating said base metal of said second segment ends with a layer of solderable metal, followed by a layer of noble metal; and trimming and forming said second segment ends.

13. The method according to claim 12 further comprising the steps of:

deflashing and cleaning said exposed second segment ends after said step of encapsulating; and activating said exposed second segment ends before said step of electrolytically plating.

* * * * *